(12) United States Patent
Mizumura et al.

(10) Patent No.: US 6,798,307 B2
(45) Date of Patent: Sep. 28, 2004

(54) SHEET SUBSTRATE FOR CRYSTAL OSCILLATOR AND METHOD OF MANUFACTURING SURFACE-MOUNT CRYSTAL OSCILLATORS USING SAME

(75) Inventors: Hiroaki Mizumura, Saitama (JP); Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/403,233

(22) Filed: Mar. 28, 2003

(65) Prior Publication Data

US 2003/0184398 A1 Oct. 2, 2003

(30) Foreign Application Priority Data

Mar. 29, 2002 (JP) ........................................ 2002-096434

(51) Int. Cl.⁷ ................................................. H03B 5/32
(52) U.S. Cl. ...................... 331/158; 331/116 R; 331/66; 331/176; 310/311; 310/348; 257/48
(58) Field of Search .................. 257/48, 620; 331/158, 331/116 R, 66, 176; 310/311, 348

(56) References Cited

U.S. PATENT DOCUMENTS 6,590,225 B2 * 7/2003 Whetsel et al. ................ 257/48
6,630,685 B1 * 10/2003 Lunde .......................... 257/48

* cited by examiner

Primary Examiner—Michael B Shingleton
(74) Attorney, Agent, or Firm—Knobbe Martens Olson & Bear, LLP

(57) ABSTRACT

A sheet substrate for use in manufacturing surface-mount crystal oscillators has a plurality of container bodies fabricated thereon. Each of the container bodies is capable of accommodating at least one IC chip, and has a bottom face formed with a plurality of mount terminals and a top face which is capable of forming a crystal unit thereto. On the sheet substrate, each of the container bodies has a conductive path extending from the container body to an adjacent container body and connected to a mount terminal of the adjacent container body, and a chip carrying terminal connected to one end of the conductive path for use in electric connection with the IC chip.

12 Claims, 6 Drawing Sheets

US 6,798,307 B2

SHEET SUBSTRATE FOR CRYSTAL OSCILLATOR AND METHOD OF MANUFACTURING SURFACE-MOUNT CRYSTAL OSCILLATORS USING SAME

BACKGROUND OF THE INVENTION

1. Field of the Invention

The present invention relates to a surface-mount crystal oscillator, and more particularly, to a sheet substrate for use in assembling surface-mount crystal oscillators, and to a method of manufacturing surface-mount crystal oscillators using the sheet substrate.

2. Description of the Related Art

Surface-mount quartz crystal oscillators, which have a surface-mount container that contains a quartz crystal unit and an oscillator circuit connected to the crystal unit, are widely used as reference sources for the frequency or time in portable electronic devices because of their compact size and light weight. Among these surface-mount crystal oscillators, particularly widely used for portable telephones and the like are surface-mount temperature-compensated crystal oscillators which compensate the oscillation frequency for variations due to a varying temperature in the ambient.

FIG. 1 is a partially broken front view illustrating an exemplary configuration of a conventional surface-mount temperature-compensated crystal oscillator. This temperature-compensated crystal oscillator has container body 1 substantially in rectangular solid which is made, for example, of laminated ceramic and formed with a recess. Container body 1 contains IC (integrated circuit) chip 2 and quartz crystal blank 3. Lid 4 covers the recess, for example, by seam welding to enclose IC chip 2 and crystal blank 3 in the recess. Integrated in IC chip 2 are an oscillator circuit connected to crystal blank 3, and a temperature compensating mechanism for compensating the oscillation frequency for variations caused by a varying temperature in the ambient. IC chip 2 is secured on the bottom of the recess in container body 1 by facedown bonding using bumps or the like. As illustrated in FIG. 2, crystal blank 3 is, for example, a substantially rectangular AT-cut crystal blank which is formed with excitation electrodes 5 on both main surfaces, respectively. Lead-out electrodes 6 extend from respective excitation electrodes 5 to both corners on one side of crystal blank 3. Crystal blank 3 is held in the recess by securing the both corners on the one side to a step formed in the recess by conductive adhesive 7 or the like. In this way, lead-out electrodes 6 are electrically connected to IC chip 2 through a circuit pattern, not shown, or the like formed in the recess.

Generally, container body 1 is provided with mount terminals 8 at four corners on the bottom face thereof for use in surface-mounting the crystal oscillator on a circuit board or the like. Mount terminals 8 are electrically connected to IC chip 2 through via-holes or the like formed through container body 1.

A pair of opposing side faces of container body 1 are formed with data write terminals 9a electrically connected to a temperature compensating mechanism of IC chip 2 for use in writing data for temperature compensation into the temperature compensating mechanism. In addition, another pair of opposing side faces of container body 1 are formed with crystal measurement terminals 9b electrically connected to lead-out electrodes 6 of crystal blank 3 for confirming the electric characteristic of the crystal unit itself which is comprised of crystal blank 3. Since the frequency-temperature characteristic differs from one crystal blank to another, the temperature dependency of the oscillation frequency is measured for each crystal oscillator to write temperature compensation data corresponding to the measured characteristic into the temperature compensating mechanism through data write terminals 9a prior to the shipment of the crystal oscillator.

In recent years, a reduction in size or miniaturization has been increasingly required for the surface-mount temperature-compensated crystal oscillators, and there is an ongoing need for a crystal oscillator which has the dimensions of 3.2 mm×2.5 mm and a thickness (height) of 1.0 mm, by way of example. Such advancement in miniaturization gives rise to a problem that no margin can be ensured to form data write terminals 9a and crystal measuring terminals 9b on the side faces of container body 1. Particularly, it is difficult to form these terminals on the shorter ones of the sides which define the geometry of container body 1. While a reduction in size can be contemplated for data write terminals 9a and crystal measuring terminal 9b themselves, these terminals must be provided with minimal areas which are determined from the relationship with probes from a measuring device used for measuring the characteristic of crystal blank 3 or writing temperature compensation data. In addition, reduced spacings between these terminals and mount terminals 8 would cause short-circuiting of both through soldering scobs or the like which can be produced upon mounting to an external circuit board.

Furthermore, although data write terminals 9a and crystal measuring terminals 9b are required only when the crystal oscillator is manufactured and are not basically needed after the manufacturing, they are left on the crystal oscillator even after the shipment, thereby possibly causing troubles after a consumer has mounted the crystal oscillator on a circuit board or the like. The troubles occur with a higher probability as a larger number of terminals are formed on the side faces of the container body.

SUMMARY OF THE INVENTION

It is an object of the present invention to provide a sheet substrate which is used for the manufacturing of a surface-mount crystal oscillator and which is suitable for a reduction in size of the crystal oscillator.

It is another object of the present invention to provide a method of manufacturing surface-mount crystal oscillators which are suitable for a reduction in size.

The object of the present invention is achieved by a sheet substrate for collectively fabricating a plurality of container bodies each for use in a surface-mount crystal oscillator in a manner that the container bodies are integrally connected to each other, wherein each of the container bodies is capable of accommodating at least one IC chip, and has a bottom face formed with a plurality of mount terminals and a top face which is capable of forming a crystal unit thereto. Each of the container bodies on the sheet substrate includes a conductive path extending from the container body to an adjacent container body and connected to a mount terminal of the adjacent container body, and a chip carrying terminal connected to one end of the conductive path for use in electric connection with the IC chip.

The other object of the present invention is achieved by a method of manufacturing surface-mount crystal oscillators using the sheet substrate according to the present invention. The method includes detecting a characteristic or writing data for each container body using the mount terminal of another container body adjacent to the container body, and subsequently dividing the sheet substrate into individual crystal oscillators.

In the present invention, since an IC chip mounted in a certain container body in the sheet substrate can be electrically connected using the mount terminal of a container body adjacent to this container body, the mount terminal of the adjacent container body can be utilized for writing data into the IC chip or for measuring the characteristic of a crystal blank in the container body. Since electric connections with adjacent container bodies are broken after the sheet substrate is divided into individual crystal oscillators, as a matter of course, the conductive paths to the adjacent container bodies will not adversely affect the operation of the resulting crystal oscillators. According to the present invention, a reduction in size is promoted for the surface-mount crystal oscillator because the container body need not be additionally provided with such terminals that are required only during the manufacturing in a factory, for example, terminals for writing data into the IC chip or measuring the characteristic of the crystal blank.

DETAILED DESCRIPTION OF THE INVENTION

Figure 1:
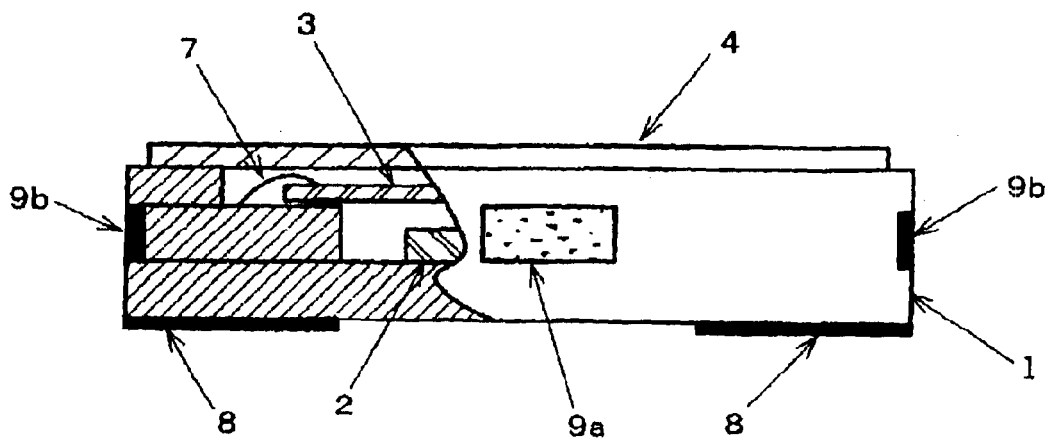
FIG. 1 is a partially broken front view illustrating an exemplary configuration of a conventional surface-mount temperature-compensated crystal oscillator.
Figure 2:
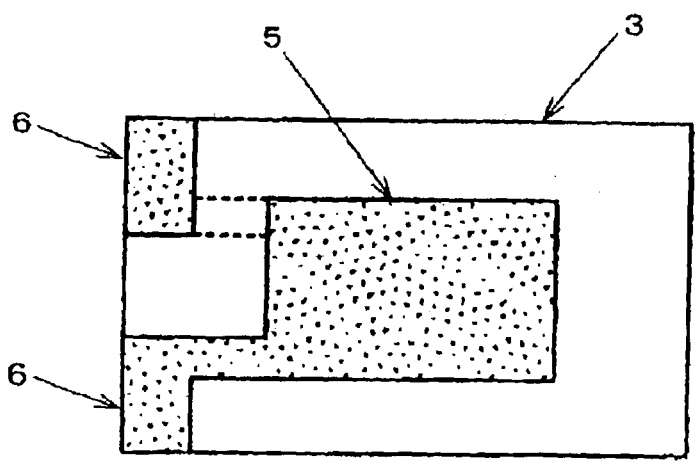
FIG. 2 is a plan view illustrating a crystal blank.
Figure 3:
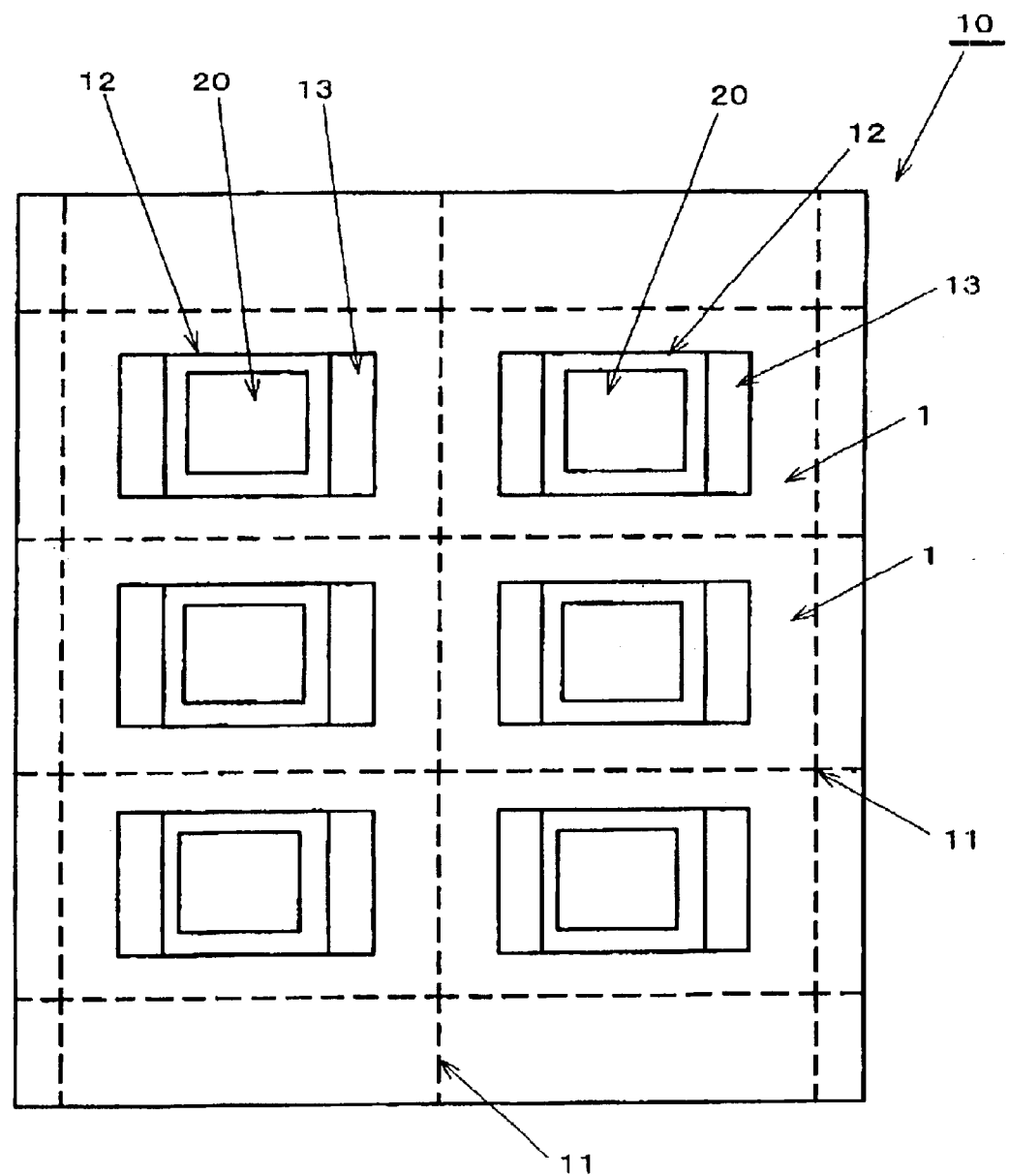
FIG. 3 is a plan view illustrating a sheet substrate according to one embodiment of the present invention.
Figure 4:
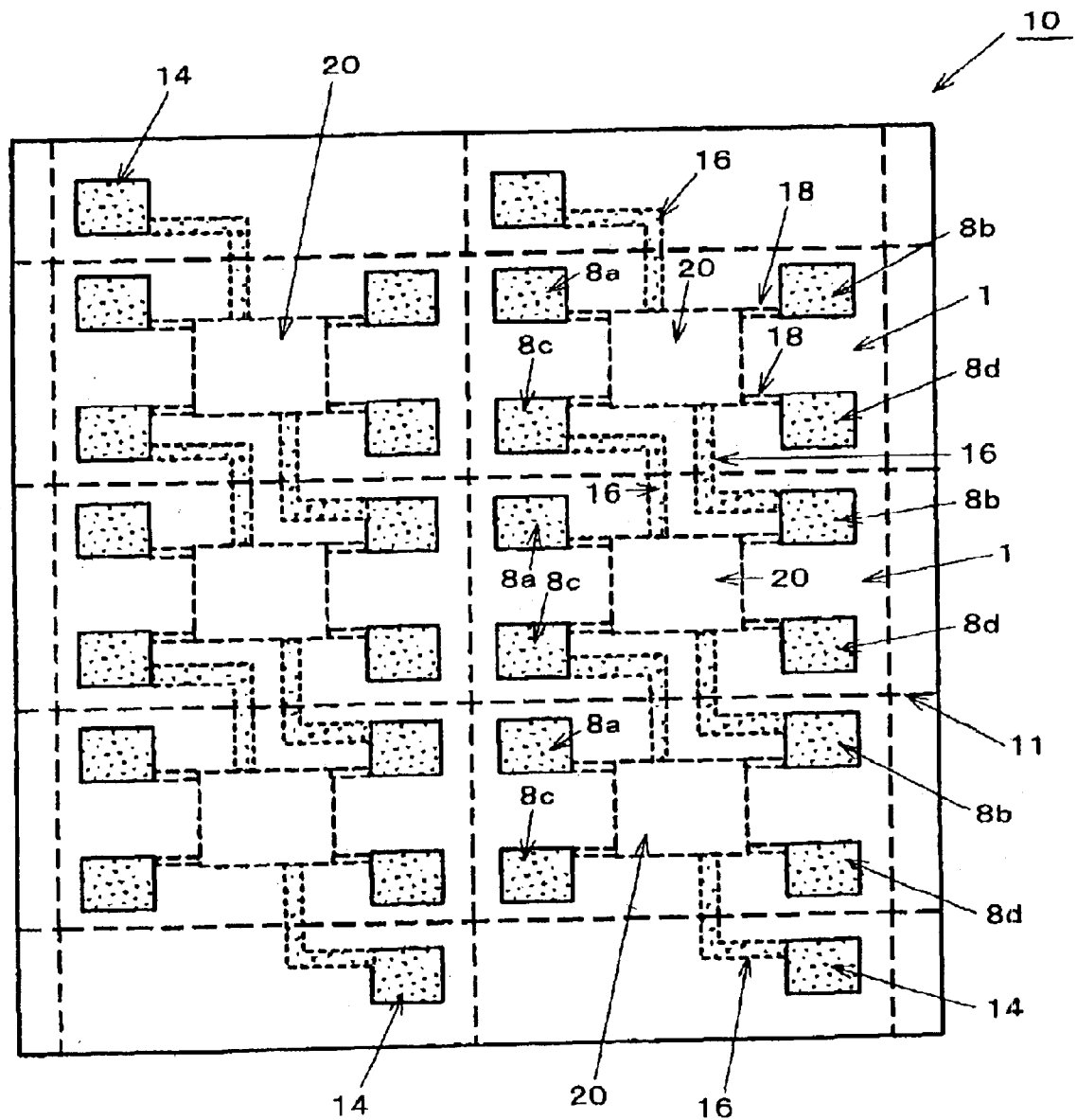
FIG. 4 is a bottom view of the sheet substrate illustrated in FIG. 3.

In FIGS. 3 and 4 which illustrate a sheet substrate according to one embodiment of the present invention, the same components as those in FIGS. 1 and 2 are designated the same reference numerals.

Sheet substrate 10 for forming oscillators is used for collectively manufacturing a plurality of surface-mount crystal oscillators. Thus, sheet substrate 10 has a shape corresponding to a plurality of container bodies 1 of respective crystal oscillators integrally connected in two-dimensional directions. Since the container body of the crystal oscillator is typically made of laminated ceramic, sheet substrate 10 is also made of laminated ceramic. As described later, sheet substrate 10 is divided into individual crystal oscillators after crystal blanks and IC chips are secured on sheet substrate 10, where respective container bodies 10 are separated from sheet substrate 10 along break lines designated by reference numeral 11. As illustrated, an area corresponding to each container body 1 on sheet substrate 10 is substantially rectangular.

Recess 12 similar to that illustrated in FIG. 1 is formed in each area corresponding to each container body 1 on one main surface of sheet substrate 10 for accommodating IC chip 2 and crystal blank 3. Recess 12 is formed with step 13. Since IC chip 2 is mounted on the bottom of recess 12, the location at which IC chip 2 should be placed is indicated by reference numeral 20.

Figure 5:
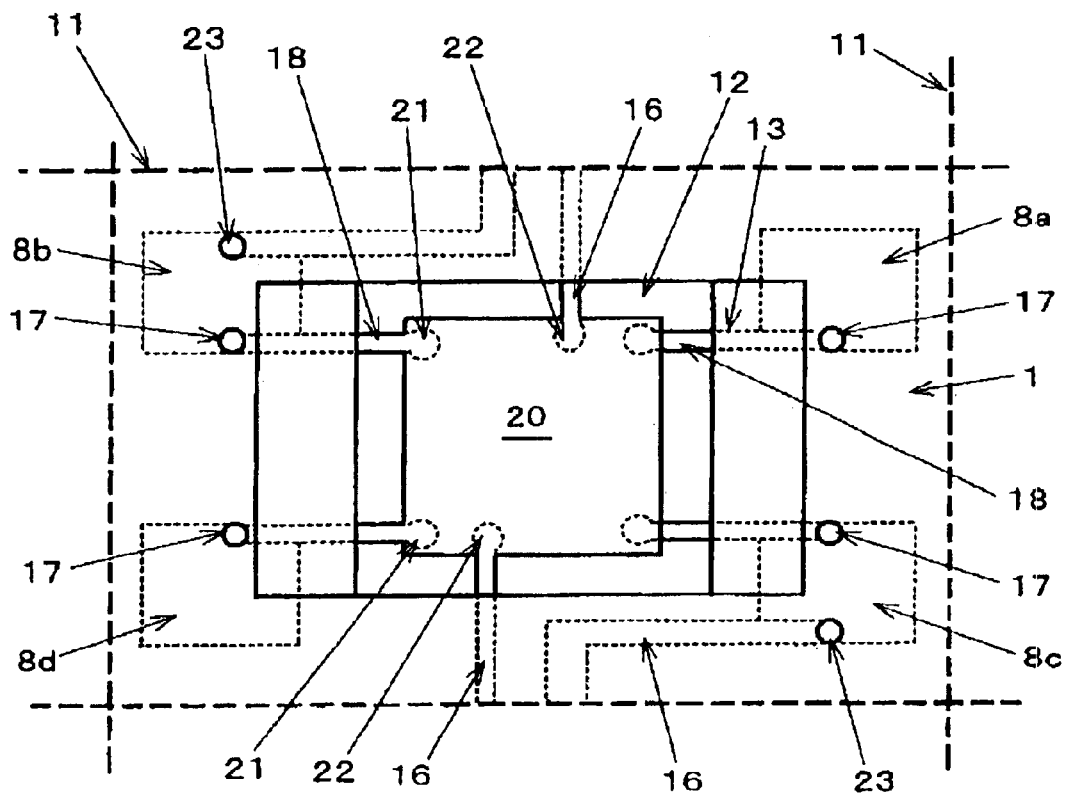
FIG. 5 is an enlarged plan view illustrating an IC chip carrier portion.

Mounting terminals 8a to 8d are formed at four corners of each area corresponding to each container body 1 on the other main surface of sheet substrate 10. Mounting terminals 8a to 8d are connected to chip carrying terminals 21 formed on IC chip carrier portion 20 through through-holes 17 (see FIG. 5) and conductive paths 18 routed on the bottom of recess 23 in respective container body 1. Chip carrying terminals 21 are used to be connected to terminals associated with power supply, grounding, oscillation output and the like, through bumps, among terminals formed on the surface of IC chip 2.

Further, in this embodiment, conductive paths 16, each of which has another chip carrying terminal 22 formed at one end, extend from IC chip carrier portion 20 toward upward and downward adjacent container bodies 1. Specifically, one conductive path 16 is connected to mount terminal 8c in upward adjacent container body 1 from the upper side of IC chip carrier portion 20 across break line 11. Similarly, the other conductive path 16 is connected to mount terminal 8b in downward adjacent container body 1 from the lower side of IC chip carrier portion 20 across break line 11. Conductive paths 16 are electrically connected to mount terminals 8b and 8c through through-holes 23 which extend through the laminated ceramic that constitutes sheet substrate 10.

Since mount terminals 8b and 8c are positioned on a diagonal line, when considered in a single container body, conductive paths 16 are in fact formed in oblique directions opposite to each other from IC chip carrier portion 20 of each container body 1 to upward and downward adjacent container bodies 1, and connected to the mount terminals on the adjacent container bodies, respectively, in this embodiment. It should be noted that although no upward adjacent container bodies exist above uppermost container bodies 1 of sheet substrate 10, dummy terminals 14 are formed on the upper side of sheet substrate 10 in a similar manner to mount terminals 8c for extending conductive paths 16 thereto. Likewise, although no downward adjacent container bodies exist below lowermost container bodies 1 of sheet substrate 10, dummy terminal 14 are formed on the lower side of sheet substrate 10 in a similar manner to mount terminals 8b for extending conductive paths 16 thereto.

Chip carrying terminals 22 connected to conductive paths 16 are connected to terminals which are connected to a temperature compensating mechanism of IC chip 2 among terminals formed on the surface of IC chip 2.

Figure 6:
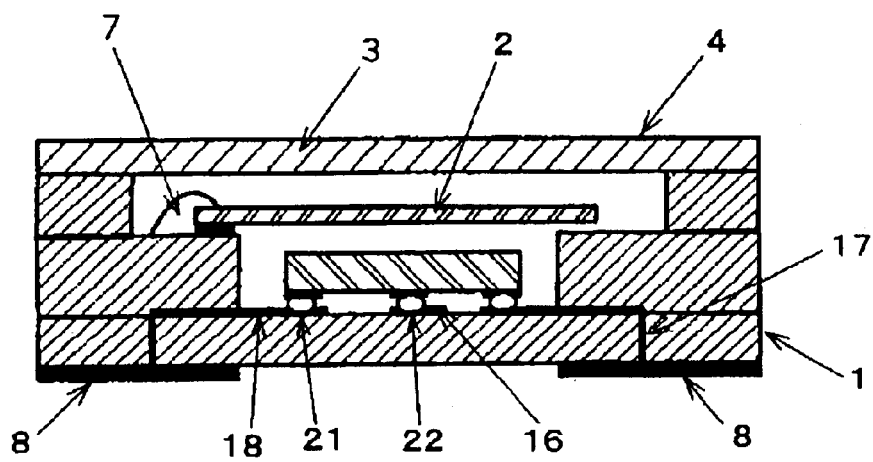
FIG. 6 is a cross-sectional view illustrating a surface-mount temperature-compensated crystal oscillator using the sheet substrate illustrated in FIGS. 3 and 4.

FIG. 6 is a cross-sectional view illustrating a surface-mount temperature-compensated crystal oscillator using the sheet substrate illustrated in FIGS. 3 and 4. In FIG. 6 which illustrates the finished crystal oscillator according to this embodiment, respective mount terminals 8a to 8d are generally designated by reference numeral 8.

Next, description will be made on a process of manufacturing surface-mount temperature-compensated crystal oscillators using the sheet substrate as described above.

With sheet substrate 10 prepared as described above, IC chip 2 and crystal blank 3 are secured on the bottom face and step 13, respectively, of each container body 1. Then, lid 4 is overlaid to cover each recess of sheet substrate 10, for example, by welding using an electron beam to simultaneously form a plurality of crystal oscillators. Next, the frequency-temperature characteristic is measured for each crystal oscillator, as it is being operated, to acquire compensation data required for temperature compensation.

Then, for a certain crystal oscillator, compensation data is written into the temperature compensating mechanism of IC chip 2 in the crystal oscillator through mount terminals 8c and 8b in upward and downward adjacent container bodies 1, respectively, to which conductive paths 16 extend from the crystal oscillator. This processing is repeated to form a large number of temperature-compensated crystal oscillators on sheet substrate 10. For those crystal oscillators which are arranged along the upper edge or lower edge of sheet substrate 10, the compensation data is written thereinto by using dummy terminals 14 in addition to mount terminals. Finally, sheet substrate 10 is divided along break lines 11 into individual temperature-compensated crystal oscillators, i.e., individual container bodies 1, each of which accommodates IC chip 2 and crystal blank 3.

In the configuration as described above, since sheet substrate 10 is divided into individual container bodies 1 after the compensation data has been written into the temperature compensating mechanism through mount terminals 8c and 8b of adjacent container bodies 1 used as data write terminals, each container body 1 need not be additionally formed with data write terminals for writing the compensation data. Consequently, when the finished surface-mount crystal oscillator is mounted on an external circuit board, the surface-mount crystal oscillator is prevented from short-circuiting due to soldering scobs or the like, and facilitates a reduction in size thereof which is beneficial for surface-mounting. In the foregoing configuration, the crystal oscillator is not provided with terminals which are electrically connected directly to crystal blank 3, so that no confirmation is made on the characteristic of the crystal unit itself.

It should be noted that chip carrying terminals 22 at the leading ends of conductive paths 16 may be connected to terminals in IC chip 2 which are electrically connected directly to crystal blank 3 to permit an external measurement of the characteristic of the crystal unit itself. In this event, however, a general surface-mount crystal oscillator is provided because temperature compensation data cannot be written into IC chip 2.

Figure 7:
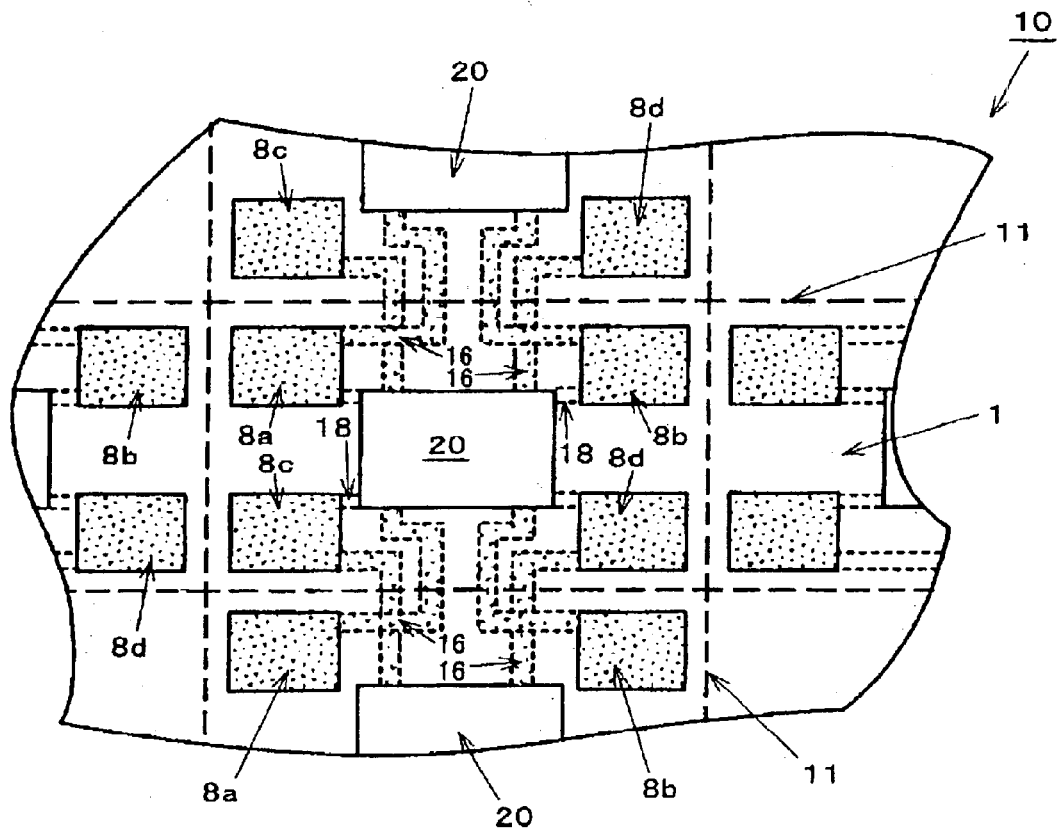
FIG. 7 is a bottom view illustrating a main portion of a sheet substrate according to another embodiment of the present invention.

FIG. 7 illustrates sheet substrate 10 according to another embodiment of the present invention. In sheet substrate 10 illustrated in FIGS. 3 and 4, mount terminals 8c and 8b of upward and downward adjacent container bodies 1 are used for writing compensation data or measuring the characteristic of the crystal unit, whereas in sheet substrate 10 illustrated in FIG. 7, container body 1 is provided with a pair of conductive paths 16 which are connected to mount terminals 8c and 8d of an upward adjacent container body, respectively. Similarly, container body 1 is also provided with another pair of conductive paths 16 which are connected to mount terminals 8a and 8b of a downward adjacent container body, respectively. Thus, for example, mount terminals 8c and 8d of the upward adjacent container body are used as data write terminals, while mount terminals 8a and 8b of the downward adjacent container body are used as terminals for measuring the characteristic of the crystal unit.

In the configuration as described above, since the mount terminals in the adjacent container bodies are used either as the data write terminals or as the crystal measuring terminals, the characteristic of the crystal unit, particularly after encapsulation, can be confirmed for the temperature-compensated crystal oscillator without providing these terminals on the side faces of container body 1.

While the foregoing description has been made on the assumption that the crystal oscillator requires a total of four terminals, i.e., two each of data write terminals and crystal measuring terminals, a total of five or more such terminals, if required for a crystal oscillator, may be provided by use of mount terminals of containers which adjoin on the left and right sides, as well as the mount terminals of the upward and downward adjacent container bodies. Ultimately, when each crystal oscillator has four mount terminals, a total of eight mount terminals can be used in container bodies which adjoin on the left and right sides and on the upward and downward sides for purposes of writing data, measuring the characteristic, and the like. However, a control circuit, for example, may be required in IC chip 2 if electric short-circuit can occur between any mount terminals.

While the sheet substrate according to the present invention has been described for an exemplary formation of container bodies each having a recess only in one main surface for accommodating an IC chip and a crystal blank, the present invention is not limited to the aforementioned crystal oscillator. FIGS. 8 to 11 illustrate respectively exemplary crystal oscillators to which the present invention can be applied.

Figure 8:
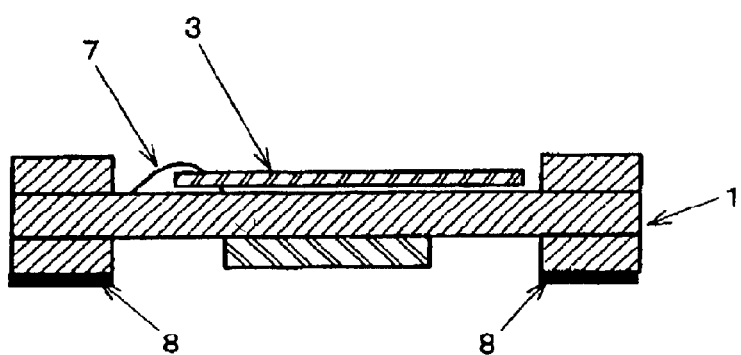
FIGS. 8 to 11 are cross-sectional views illustrating examples of the surface-mount crystal oscillators using the sheet substrate according to the present invention, respectively.

A crystal oscillator illustrated in FIG. 8 has a container body having an H-shaped cross section because of recesses formed in both top and bottom faces of the container body. Crystal blank 3 is accommodated in one recess, while IC chip 2 is accommodated in the other recess. In this example, mount terminals 8 are formed at four corners of the bottom face of the container body.

Figure 9:
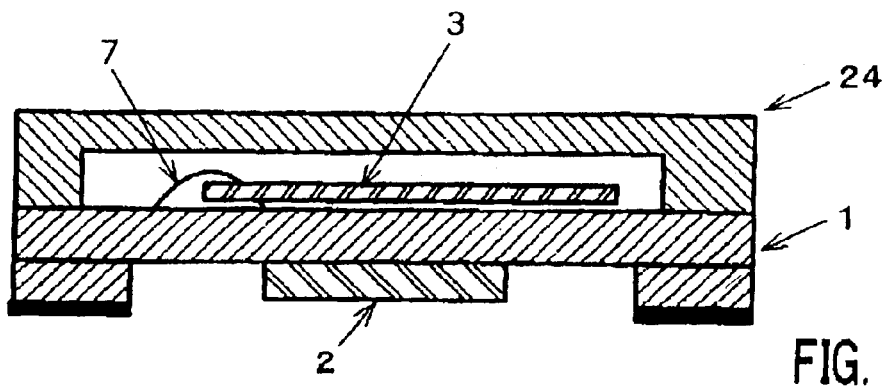

In a crystal oscillator illustrated in FIG. 9, though similar to that of FIG. 8, a recess for accommodating crystal blank 3 is not formed in container body 1, and instead recessed lid 24 is bonded to encapsulate crystal blank 3 between lid 24 and the top face of container body 1.

Figure 10:
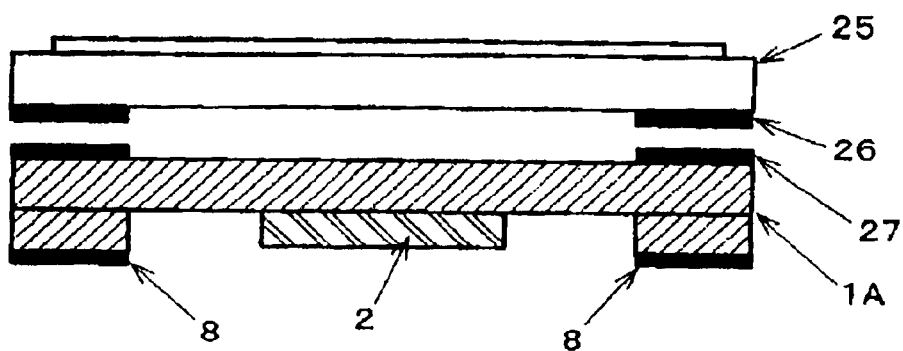
Figure 11:
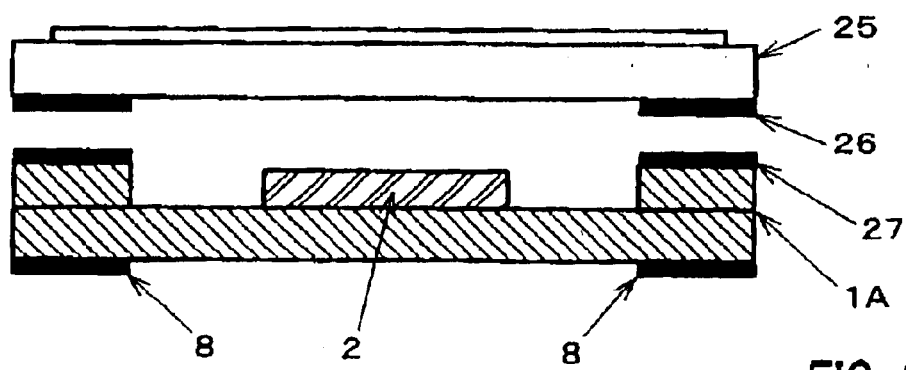

FIGS. 10 and 11 each illustrates a crystal oscillator which comprises crystal unit 25 in which a crystal blank is encapsulated, and mounting substrate 1A bonded on the bottom face of crystal unit 25. IC chip 2 is accommodated in mounding substrate 1A. Crystal connection terminals 26 are provided at four corners of the bottom face of crystal unit 25 for connection to the crystal unit, and bonding terminals 27 are provided at four corners of the top face of mounting substrate 1A for bonding to crystal connection terminals 26. Crystal connection terminals 26 are bonded to bonding terminals 27 to connect crystal unit 25 to mounting substrate 1A. The crystal oscillator illustrated in FIG. 10 has mounting substrate 1A formed with a recess on the bottom face thereof in which IC chip 2 is accommodated, while the crystal oscillator illustrated in FIG. 11 has mounting substrate 1A formed with a recess on the top face thereof in which IC chip 2 is accommodated. In either case, mount terminals 8 are formed on the bottom face of mounting substrate 1A which corresponds to the container body in the present invention.

In essence, the present invention is suitably applied to a crystal oscillator which has mount terminals on the lower or bottom face of a container body, and a crystal blank or a crystal unit disposed on the top face.

What is claimed is:

1. A sheet substrate for collectively fabricating and a plurality of container bodies each for use in a surface-mount crystal oscillator in a manner that said plurality of container bodies are integrally connected to each other, each said container body being capable of accommodating at least one IC chip, and having a bottom face formed with a plurality of mount terminals and a top face which is capable of forming a crystal unit thereto, each said container body comprising:

a conductive path extending from said container body to an adjacent container body and connected to a mount terminal of said adjacent container body; and a chip carrying terminal connected to one end of said conductive path for use in electric connection with said IC chip.

2. The sheet substrate according to claim 1, wherein said sheet substrate comprises laminated ceramic.

3. The sheet substrate according to claim 1, wherein each said container body includes a recess formed on the top face, a step formed in said recess, said recess being configured to receive said IC chip on the bottom face thereof, and a crystal blank having one end secured to said step.

4. The sheet substrate according to claim 1, wherein in each said container body, said conductive path extends from said container body to an adjacent container body adjoining said container body in a first direction and extends from said container body to another adjacent container body adjoining said container body in a second direction which is opposite to the first direction.

5. The sheet substrate according to claim 4, wherein in each said container body, two conductive paths extend from said container to the adjacent container body adjoining in the first direction, and other two conductive paths extend from said container to the adjacent container body adjoining in the second direction.

6. The sheet substrate according to claim 1, wherein said chip carrying terminal is used for electric connection with a terminal through which temperature compensation data is written into said IC chip.

7. The sheet substrate according to claim 1, wherein said chip carrying terminal is used for electric connection with a terminal of said IC chip electrically connected to said crystal unit.

8. The sheet substrate according to claim 4, wherein said chip carrying terminal is used for electric connection with a terminal through which temperature compensation data is written into said IC chip.

9. The sheet substrate according to claim 5, wherein said chip carrying terminals are used for electric connection with a terminal through which temperature compensation data is written into said IC chip, and for electric connection with a terminal of said IC chip electrically connected to said crystal unit.

10. A method of manufacturing surface-mount crystal oscillators comprising the steps of:

providing a sheet substrate for collectively fabricating a plurality of container bodies each for use in a surface-mount crystal oscillator, each said container body being capable of accommodating at least one IC chip, and having a bottom face formed with a plurality of mount terminals and a top face which is capable of forming a crystal unit thereto, each said container body on said substrate sheet comprising a conductive path extending from said container body to an adjacent container body and connected to a mount terminal of said adjacent container body, and a chip carrying terminal connected to one end of said conductive path for use in electric connection with said IC chip;

accommodating said IC chip and forming said crystal unit in each container body of said sheet substrate;

writing temperature compensation data into said IC chip in each said container body using the mount terminal of the adjacent container body; and dividing said sheet substrate into individual crystal oscillators.

11. The method according to claim 6, further comprising the step of operating each said crystal oscillator to acquire temperature compensation data after said accommodating step and before said writing step.

12. A method of manufacturing surface-mount crystal oscillators comprising the steps of:

providing a sheet substrate for collectively fabricating a plurality of container bodies each for use in a surface-mount crystal oscillator, each said container body being capable of accommodating at least one IC chip, and having a bottom face formed with a plurality of mount terminals and a top face which is capable of forming a crystal unit thereto, each said container body on said substrate sheet comprising a conductive path extending from said container body to an adjacent container body and connected to a mount terminal of said adjacent container body, and a chip carrying terminal connected to one end of said conductive path for use in electric connection with said IC chip;

detecting a characteristic of said crystal unit for each container body using the mount terminal of the adjacent container body; and dividing said sheet substrate into individual crystal oscillators.

* * * * *